United States Patent
Chung et al.

(10) Patent No.: US 8,933,625 B2
(45) Date of Patent: Jan. 13, 2015

(54) ORGANIC LIGHT EMITTING DISPLAY APPARATUS THAT CAN FUNCTION AS A MIRROR

(75) Inventors: Jin-Koo Chung, Yongin (KR); Sang-Hoon Yim, Yongin (KR); Jun-Ho Choi, Yongin (KR); Seong-Min Kim, Yongin (KR); Seung-Wook Chang, Yongin (KR); Hye-Dong Kim, Yongin (KR); Mu-Hyun Kim, Yongin (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 13/566,717

(22) Filed: Aug. 3, 2012

(65) Prior Publication Data

US 2012/0299472 A1 Nov. 29, 2012

Related U.S. Application Data

(63) Continuation-in-part of application No. 12/405,502, filed on Mar. 17, 2009.

(30) Foreign Application Priority Data

Mar. 18, 2008 (KR) .................. 10-2008-0024906

(51) Int. Cl.
*H01J 1/62* (2006.01)
*H01J 63/04* (2006.01)
(Continued)

(52) U.S. Cl.
CPC ......... *H01L 51/5271* (2013.01); *H01L 27/3246* (2013.01); *H01L 51/5246* (2013.01); *H01L 51/525* (2013.01)
USPC ............................ 313/506; 313/504; 313/512

(58) Field of Classification Search
USPC .......................................... 313/504, 506, 512
See application file for complete search history.

(56) References Cited

U.S. PATENT DOCUMENTS 4,499,451 A * 2/1985 Suzuki et al. ................. 362/494
6,538,374 B2 3/2003 Hosokawa
(Continued)

FOREIGN PATENT DOCUMENTS

| JP | 2001-155851 | 6/2001 |
| JP | 2003-122260 | 4/2003 |

(Continued)

OTHER PUBLICATIONS

Registration of Korean Determination Certificate issued Dec. 23, 2009, by the Korean Intellectual Property Office for Application No. 102008-0024906.

(Continued)

*Primary Examiner* — Thomas A Hollweg
(74) *Attorney, Agent, or Firm* — Christie, Parker & Hale, LLP

(57) ABSTRACT

An organic light emitting display apparatus includes a substrate and a sealing member that are separated from each other; a pixel electrode on the substrate; a pixel defining layer on the pixel electrode and exposing a portion of the pixel electrode; an intermediate layer including a light emitting layer on the exposed portion of the pixel electrode; a facing electrode on the pixel defining layer and the intermediate layer; and a reflection member on a surface of the sealing member facing the substrate and patterned to have an opening portion that exposes the pixel electrode, wherein the opening portion is formed such that a boundary portion of the opening portion is closer to a center of the intermediate layer than a boundary portion of the portion of the pixel electrode exposed by the pixel defining layer.

6 Claims, 6 Drawing Sheets

(51) Int. Cl.
*H01L 51/52* (2006.01)
*H01L 27/32* (2006.01)

(56) References Cited

U.S. PATENT DOCUMENTS

| | | |
|---|---|---|
| 6,933,672 B2 | 8/2005 | Hosokawa |
| 6,958,796 B2 | 10/2005 | Takizawa |
| 7,158,694 B2 | 1/2007 | Hayashi et al. |
| 7,825,570 B2 * | 11/2010 | Cok ............... 313/116 |
| 8,044,580 B2 | 10/2011 | Yamazaki et al. |
| 8,058,795 B2 | 11/2011 | Asano |
| 2002/0011783 A1 | 1/2002 | Hosokawa |
| 2002/0033664 A1 | 3/2002 | Kobayashi |
| 2003/0151354 A1 | 8/2003 | Takizawa |
| 2004/0251824 A1 * | 12/2004 | Chen et al. ............... 313/506 |
| 2005/0194891 A1 | 9/2005 | Wu et al. |
| 2005/0248266 A1 | 11/2005 | Hosokawa |
| 2006/0158095 A1 * | 7/2006 | Imamura ............... 313/500 |
| 2006/0158110 A1 | 7/2006 | Kim et al. |
| 2006/0267030 A1 | 11/2006 | Yamazaki et al. |
| 2007/0262707 A1 | 11/2007 | Lee et al. |
| 2008/0054802 A1 * | 3/2008 | Cok ............... 313/506 |
| 2008/0185958 A1 * | 8/2008 | Yoon et al. ............... 313/504 |
| 2008/0303435 A1 * | 12/2008 | Cok ............... 313/506 |
| 2009/0079336 A1 * | 3/2009 | Yamada et al. ............... 313/504 |
| 2009/0140638 A1 | 6/2009 | Asano |
| 2010/0090595 A1 * | 4/2010 | Nomura et al. ............... 313/506 |
| 2010/0102301 A1 | 4/2010 | Yang et al. |
| 2010/0177265 A1 * | 7/2010 | Jung et al. ............... 349/69 |
| 2010/0237374 A1 * | 9/2010 | Chu et al. ............... 257/98 |
| 2013/0001602 A1 * | 1/2013 | Park et al. ............... 257/88 |
| 2013/0099660 A1 * | 4/2013 | Shen et al. ............... 313/512 |

FOREIGN PATENT DOCUMENTS

| | | | |
|---|---|---|---|
| JP | 2005-332616 | | 12/2005 |
| JP | 2006011043 A | * | 1/2006 |
| JP | 2008-192314 | | 8/2008 |
| KR | 2003-0047838 | | 6/2003 |
| KR | 10-2006-0057433 | | 5/2006 |
| KR | 10-2007-0043077 A | | 4/2007 |
| KR | 10-2009-0039392 A | | 4/2009 |
| KR | 10-2010-0047456 | | 5/2010 |

OTHER PUBLICATIONS

Office Action issued Jul. 31, 2009 by Korean Intellectual Property Office in Korean Patent Application No. 10-2008-0024906.

* cited by examiner

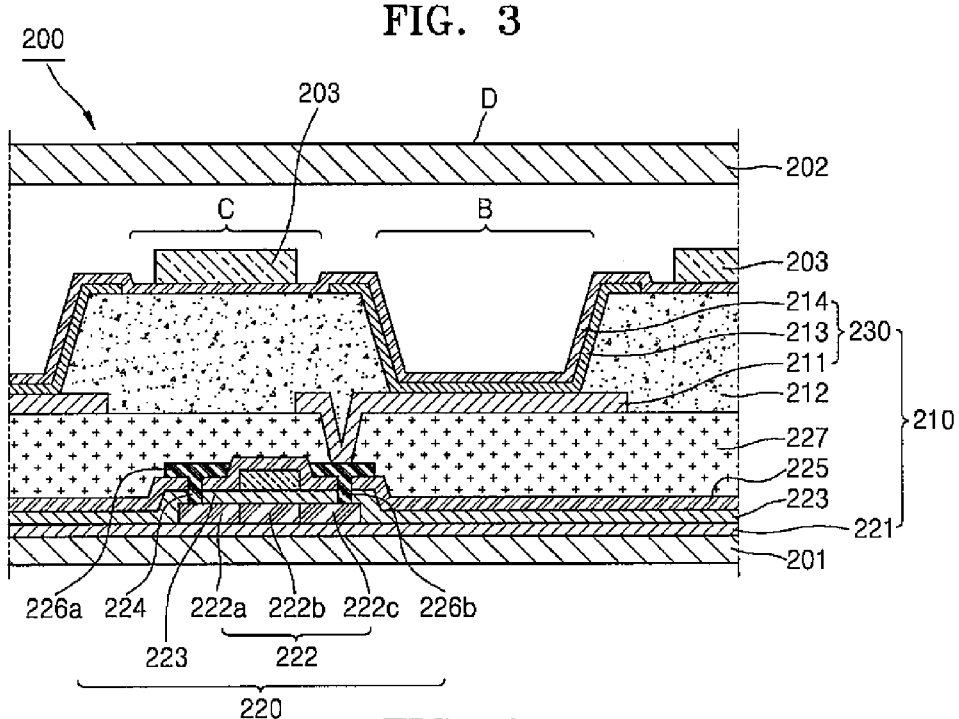
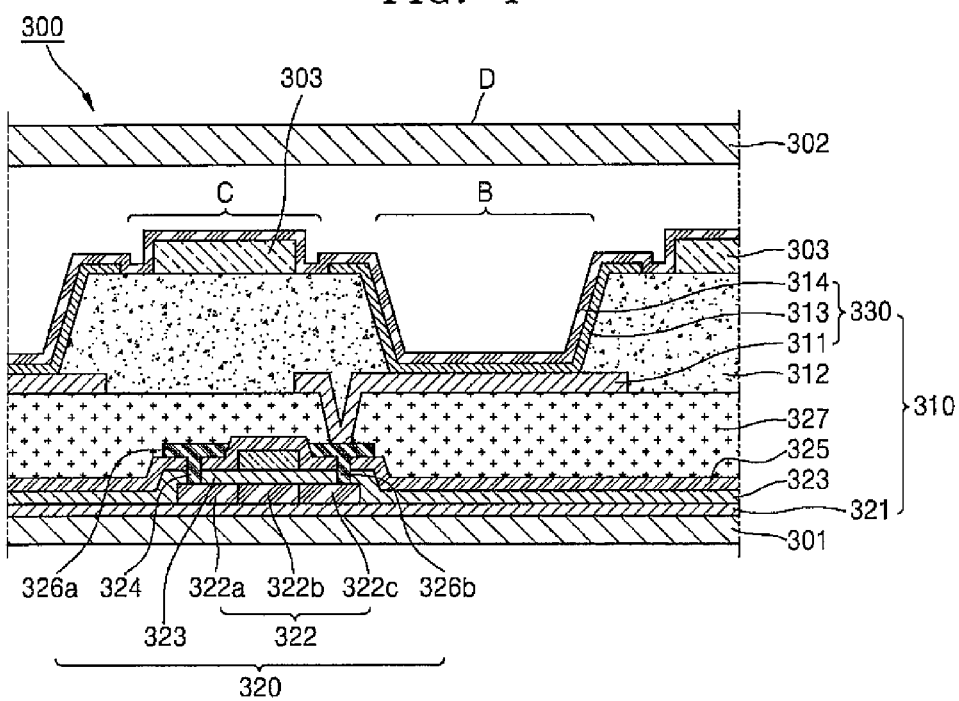

ORGANIC LIGHT EMITTING DISPLAY APPARATUS THAT CAN FUNCTION AS A MIRROR

CROSS-REFERENCE TO RELATED APPLICATION

This application is a continuation-in-part of U.S. patent application Ser. No. 12/405,502, filed Mar. 17, 2009, which claims priority to and the benefit of Korean Patent Application No. 10-2008-0024906, filed Mar. 18, 2008, the entire content of both of which is incorporated herein by reference.

BACKGROUND

1. Field

Aspects of the present invention relate to an organic light emitting display apparatus, and more particularly, to an organic light emitting display apparatus functioning both as a display apparatus and as a mirror.

2. Description of Related Art

Organic light emitting display apparatuses are emissive display apparatuses that generate light by re-combination of electrons and holes in a light emitting layer when a voltage is applied to an organic film that includes an anode, a cathode, and an organic light emitting layer interposed between the anode and the cathode. Organic light emitting display apparatuses are expected to be the next generation of display apparatuses because of their advantages such as light weight, low thickness, wide viewing angle, short response time, and low power consumption as compared to cathode ray tubes or liquid crystal displays.

In an organic light emitting display apparatus, an organic light emitting device is disposed in a display region. The organic light emitting display apparatus includes a pixel electrode and a facing electrode facing each other, and a light emitting layer interposed between the pixel electrode and the facing electrode. Since the organic light emitting display apparatus is easily damaged by foreign materials such as moisture or oxygen penetrating from the outside, the organic light emitting display apparatus is sealed so that penetration of foreign materials from the outside can be prevented.

SUMMARY

To address the above and/or other problems, aspects of the present invention provide an organic light emitting display apparatus that can also function as a mirror where an organic light emitting device of the organic light emitting display apparatus does not generate light.

One aspect of the present invention provides an organic light emitting display apparatus including: a substrate; an organic light emitting unit formed on the substrate; a reflection member disposed on a non-light emitting region of the organic light emitting unit; and a sealing member that seals the organic light emitting unit. The sealing member may be separately disposed from the organic light emitting unit.

The organic light emitting display apparatus may further include a combining member that combines the substrate and the sealing member. The combining member may be disposed along edges of the substrate. The combining member may comprise spacers and a sealant.

The reflection member may be formed on a surface of the sealing member that faces the organic light emitting unit to correspond to the non-light emitting region of the organic light emitting unit. The organic light emitting display apparatus may further include an optical absorption layer on a surface of the reflection member facing the organic light emitting unit. The reflection member may be formed of a material that reflects light proceeding towards the reflection member from outside of the organic light emitting display apparatus. The reflection member may be formed of a metal that reflects light proceeding towards the reflection member from outside of the organic light emitting display apparatus. The reflection member may be formed of Al. The reflection member may have a thickness of 250 Å or more.

Another aspect of the present invention provides an organic light emitting display apparatus including: a substrate; a pixel electrode formed on the substrate; a pixel defining layer that is formed on the pixel electrode and exposes a portion of the pixel electrode; an intermediate layer having a light emitting layer formed on the exposed pixel electrode; a facing electrode formed on the pixel defining layer and the intermediate layer; and a reflection member formed on the facing electrode to correspond to the pixel defining layer.

The reflection member may be formed of a material that reflects light proceeding towards the reflection member from outside of the organic light emitting display apparatus. The reflection member may be formed of a metal that reflects light proceeding towards the reflection member from outside of the organic light emitting display apparatus. The reflection member may be formed of Al. The reflection member may have a thickness of 250 Å or more. The pixel electrode may be a reflective electrode and the facing electrode may be a transparent electrode.

A third aspect of the present invention provides an organic light emitting display apparatus including: a substrate; a pixel electrode formed on the substrate; a pixel defining layer that is formed on the pixel electrode and exposes a portion of the pixel electrode; an intermediate layer having a light emitting layer formed on the exposed pixel electrode; a reflection member formed on the facing electrode to correspond to the pixel defining layer; and a facing electrode formed to cover the intermediate layer and the reflection member.

The reflection member may be formed of a material that reflects light proceeding towards the reflection member from outside of the organic light emitting display apparatus. The reflection member may be formed of a metal that reflects light proceeding towards the reflection member from outside of the organic light emitting display apparatus. The reflection member may be formed of Al. The reflection member may have a thickness of 250 Å or more. The pixel electrode may be a reflective electrode and the facing electrode may be a transparent electrode. An organic light emitting display apparatus having the above structure can function both as a display apparatus and a mirror.

Another aspect of the present invention provides an organic light emitting display apparatus, including: a substrate and a sealing member that are separated from each other; a pixel electrode on the substrate; a pixel defining layer on the pixel electrode and exposing a portion of the pixel electrode; an intermediate layer including a light emitting layer on the exposed portion of the pixel electrode; a facing electrode on the pixel defining layer and the intermediate layer; and a reflection member on a surface of the sealing member facing the substrate and patterned to have an opening portion that exposes the pixel electrode, wherein the opening portion is formed such that a boundary portion of the opening portion is closer to a center of the intermediate layer than a boundary portion of the portion of the pixel electrode exposed by the pixel defining layer.

A surface area of the opening portion may be smaller than a surface area of the portion of the pixel electrode exposed by the pixel defining layer.

Light emitted from the light emitting layer may be formed into an image via the sealing member.

Another aspect of the present invention provides an organic light emitting display apparatus, including: a substrate and a sealing member that are separated from each other; a pixel electrode on a first surface of the substrate; a pixel defining layer on the pixel electrode and including a first opening portion that exposes a portion of the pixel electrode; an intermediate layer including a light emitting layer on the exposed portion of the pixel electrode; a facing electrode on the pixel defining layer and the intermediate layer; and a reflection member on a second surface of the substrate opposite the first surface and patterned to have a second opening portion that exposes the pixel electrode, wherein the second opening portion is formed such that a boundary portion of the second opening portion is closer to a center of the intermediate layer than a boundary portion of the first opening portion.

A surface area of the second opening portion may be smaller than a surface area of the first opening portion.

Light emitted from the light emitting layer may be formed into an image via the sealing member.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which:

FIG. 3 is a schematic cross-sectional view of an organic light emitting display apparatus according to a second embodiment of the present invention; and FIG. 4 is a schematic cross-sectional view of an organic light emitting display apparatus according to a third embodiment of the present invention.

DETAILED DESCRIPTION

Figure 1:
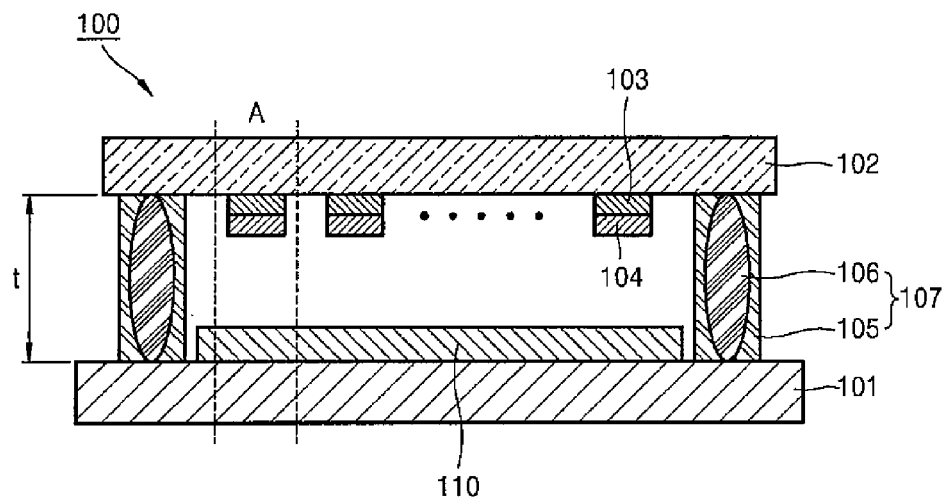
FIG. 1 is a schematic cross-sectional view of an organic light emitting display apparatus according to an embodiment of the present invention.

Reference will now be made in detail to embodiments of the present invention, examples of which are illustrated in the accompanying drawings, wherein like reference numerals refer to the like elements throughout. The embodiments are described below in order to explain the present invention by referring to the figures. Moreover, it is to be understood that where it is stated herein that one layer is "formed on" or "disposed on" a second layer, or interposed between two layers, the first layer may be formed or disposed directly on the other layers or there may be intervening layers between the first layer and the other layers. Further, as used herein, the term "formed on" is used with the same meaning as "located on" or "disposed on" or "interposed" and is not meant to be limiting regarding any particular fabrication process.

Figure 2:
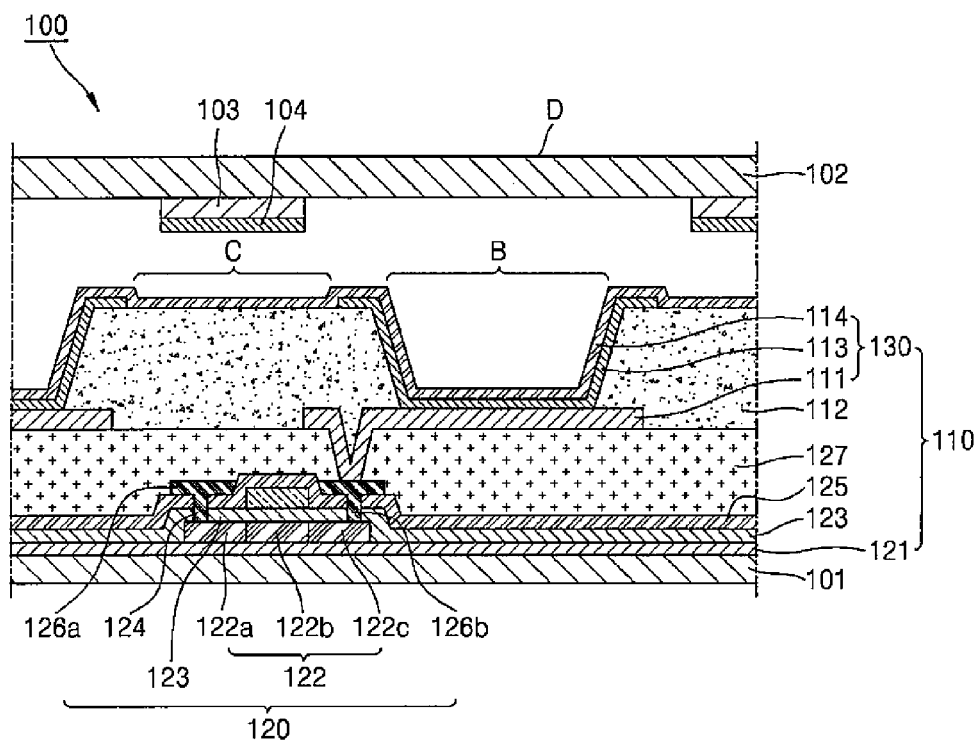
FIG. 2 is an enlarged cross-sectional view of portion A of FIG. 1.

FIG. 1 is a schematic cross-sectional view of an organic light emitting display apparatus 100 according to an embodiment of the present invention. FIG. 2 is an enlarged cross-sectional view of portion A of FIG. 1. Referring to FIGS. 1 and 2, the organic light emitting display apparatus 100 includes a substrate 101, an organic light emitting unit 110, a reflection member 103, a light absorption layer 104, and a combining member 107.

The substrate 101 can be formed of a material such as transparent glass, a plastic sheet, or silicon, and may be transparent as well as flexible or rigid. The substrate 101 is not limited to the above materials, and can be also formed of a metal plate.

The organic light emitting unit 110 is formed on the substrate 101. In the case of an active matrix organic light emitting display apparatus, the organic light emitting unit 110 can include one or more organic light emitting devices 130 and thin film transistors 120. The organic light emitting devices 130 and the thin film transistors 120 will now be described. As depicted in FIG. 2, the organic light emitting unit 110 includes a light emitting region B where the organic light emitting device 130 is formed and a non-light emitting region C where the organic light emitting device 130 is not formed. The reflection member 103 can be disposed in the non-light emitting region C, which will be described later. This embodiment is not limited to an active matrix organic light emitting display apparatus but can also be applied to a passive matrix organic light emitting display apparatus.

A sealing member 102 is disposed on an upper side of the organic light emitting unit 110 and is joined to the substrate 101. That is, as depicted in FIG. 1, the sealing member 102 can be disposed separately from the organic light emitting unit 110, and can be joined to the substrate 101 via the combining member 107. The sealing member 102 can be glass or a plastic, for example, an acrylic. In the case of a top emission type organic light emitting display apparatus, the sealing member 102 can be formed of an electrical insulating material having high transparency with respect to light generated from the organic light emitting unit 110. The electrical insulating material can be a transparent glass such as alkali glass or non-alkali glass; a transparent polymer such as polyethylene terephthalate, polycarbonate, polyether sulfone, polyvinyl fluoride (PVF) or an acrylic; a transparent ceramic such as zirconia; or quartz.

The reflection member 103 can be disposed in the non-light emitting region C of the organic light emitting unit 110. In particular, in the organic light emitting display apparatus 100 depicted in FIG. 1, the reflection member 103 can be formed on a surface of the sealing member 102 facing the organic light emitting unit 110 so that the reflection member 103 can correspond to the non-light emitting region C of the organic light emitting unit 110. More specifically, as depicted in FIG. 2, the reflection member 103 can be formed on the surface of the sealing member 102 that faces the organic light emitting unit 110 so that the reflection member 103 can correspond to a pixel defining layer 112, both of which are positioned in the non-light emitting region C. The reflection member 103 can reflect light proceeding towards the organic light emitting unit 110 from outside of the organic light emitting display apparatus 100. Thus, when the organic light emitting unit 110 does not emit light, the reflection member 103 can function as a mirror by reflecting light proceeding towards the organic light emitting unit 110 from outside of the organic light emitting display apparatus 100.

Also, since the reflection member 103 is disposed in the non-light emitting region C of the organic light emitting unit 110, and not in the light emitting region B, an optical path through which light emitted from the light emitting region B can be emitted to the outside of the organic light emitting display apparatus 100 can be ensured. In the case of a top emission type organic light emitting display apparatus 100, since the reflection member 103 is disposed in the non-light emitting region C, the light emission surface can function not only as a display unit but also as a mirror. In the case of a bottom emission type organic light emitting display apparatus, the light emission area D can function as a display unit and the non-emission surface can function as a mirror.

The reflection member 103 is formed of a material that can reflect light proceeding towards the reflection member 103 from outside of the organic light emitting display apparatus 100. For example, the reflection member 103 can be formed of a metal selected from the group consisting of Al, Cr, Ag, Fe, Pt and Hg. Preferably, Al may be used to form the reflection member 103. When Al is used, and the reflection member 103 has a thickness greater than 250 Å, the reflectivity of visible light is 75 to 90%. The light absorption layer 104 can be formed on a surface of the reflection member 103 that faces the organic light emitting unit 110. The light absorption layer 104 absorbs light emitted from the organic light emitting unit 110 and passing through the reflection member 103. The light absorption layer 104 can be a black matrix. The light absorption layer 104 can be formed of a metal such as Cr or Mo having relatively low reflectivity, or can be formed of an opaque insulating material such as CrOx or MoOx.

The combining member 107 joins the substrate 101 with the sealing member 102. The combining member 107 can be disposed on edges of the substrate 101, and the organic light emitting unit 110 is therefore surrounded by the combining member 107. The combining member 107 can include a sealant 105 and spacers 106. The spacers 106 are fully enclosed in the sealant 105, and the spacers 106 can maintain a gap t between the substrate 101 and the sealing member 102. The gap t between the substrate 101 and the sealing member 102 can be controlled by controlling the length of the spacers 106. Also, a mura effect such as a Newton ring phenomenon that can occur between the substrate 101 and the sealing member 102 can be prevented by controlling the length of the gap t of the spacers 106.

As cited above, FIG. 2 is an enlarged cross-sectional view of portion A of FIG. 1, that is, the specific configuration of the organic light emitting unit 110. Referring to FIG. 2, at least one thin film transistor 120 is formed on the substrate 101 and at least one organic light emitting device 130 is formed on a corresponding thin film transistor 120. The organic light emitting device 130 can include a pixel electrode 111 electrically connected to the thin film transistor 120, a facing electrode 114 disposed on the entire surface of the substrate 101, and an intermediate layer 113 that includes at least one light emitting layer and is disposed between the pixel electrode 111 and the facing electrode 114.

The thin film transistor 120 having a gate electrode 124, a source electrode 126a and a drain electrode 126b, a semiconductor layer 122, a gate insulating film 123, and an interlayer insulating layer 125 is formed on the substrate 101. Also, the shape of the thin film transistor 120 is not limited to the shape depicted in FIG. 2, and various thin film transistors such as an organic thin film transistor in which the semiconductor layer 122 is formed of an organic material or a silicon thin film transistor in which the semiconductor layer 122 is formed of silicon can be used. If necessary, a buffer layer 121 formed of silicon oxide $SiO_2$, silicon nitride $Si_3N_4$, or silicon oxynitride $SiO_xN_y$, can further be included between the thin film transistor 120 and the substrate 101. The buffer layer 121 improves the device characteristics by preventing penetration of impurities generated from the substrate 101 into the semiconductor layer 122.

The semiconductor layer 122 is formed on the buffer layer 121, and can be an amorphous silicon film or a crystalline silicon film. The semiconductor layer 122 can include a source region 122a, a drain region 122c, and a channel region 122b.

The semiconductor layer 122 is enclosed by the gate insulating film 123. The gate electrode 124 that corresponds to the semiconductor layer 122 and the interlayer insulating layer 125 that encloses the gate electrode 124 are formed on an upper surface of the gate insulating film 123.

The source electrode 126a and the drain electrode 126b respectively contact the source region 122a and the drain region 122c through contact holes (not shown in the Figures) that are formed in the gate insulating film 123 and the interlayer insulating layer 125.

The organic light emitting device 130 includes the pixel electrode 111 and the facing electrode 114, that face each other, and the intermediate layer 113 that is interposed between the pixel electrode 111 and the facing electrode 114 and is formed of an organic material. The intermediate layer 113 includes at least one light emitting layer, and can include a plurality of layers, which will be described later.

The pixel electrode 111 functions as an anode electrode, and the facing electrode 114 functions as a cathode electrode. Of course, the polarity of the pixel electrode 111 and the facing electrode 114 can be designed with opposite polarity.

The pixel electrode 111 can be a transparent electrode or a reflective electrode. If the pixel electrode 111 is a transparent electrode, the pixel electrode 111 can be formed of ITO, IZO, ZnO, or $In_2O_3$. If the pixel electrode 111 is a reflective electrode, the pixel electrode 111 can include a reflective film formed of Ag, Mg, Al, Pt, Pd, Au, Ni, Nd, Ir, Cr, or a combination or alloy of these metals and a film formed of ITO, IZO, ZnO, or $In_2O_3$ formed on the reflective film.

The facing electrode 114 can also be a transparent electrode or a reflective electrode. If the facing electrode 114 is a transparent electrode, the facing electrode 114 can include a film deposited to face the intermediate layer 113 interposed between the pixel electrode 111 and the facing electrode 114 using Li, Ca, LiF/Ca, LiF/Al, Al, Mg, or a combination of these materials and an auxiliary electrode or a bus electrode layer (not shown in the Figures) that is formed of a material used to form the transparent electrode, such as ITO, IZO, ZnO, or $In_2O_3$, on the film. If the facing electrode 114 is a reflective electrode, the facing electrode 114 can be formed by depositing Li, Ca, LiF/Ca, LiF/Al, Al, Mg, or a combination of these materials.

Meanwhile, the pixel defining layer 112 is formed on an outer side of the pixel electrode 111 in order to cover the edges of the pixel electrode 111. Beside the function of defining a light emission region, the pixel defining layer 112, prevents the pixel electrode 111 and the facing electrode 114 from electrically disconnecting from each other by preventing the occurrence of an electric field concentration phenomenon at an edge portion of the pixel electrode 111 through widening the gap between the edge of the pixel electrode 111 and the facing electrode 114.

Various intermediate layers 113 that include at least a light emitting layer can be included between the pixel electrode 111 and the facing electrode 114. The intermediate layer 113 can be formed of a small molecule organic material or a polymer organic material.

If the intermediate layer 113 is formed of a small molecule organic material, the intermediate layer can be formed in a single or a composite structure by stacking a hole injection layer (HIL), a hole transport layer (HTL), an emission layer (EML), an electron transport layer (ETL), and an electron injection layer (EIL) (the individual layers are not separately shown in the Figures). An organic material that can be used to form the intermediate layer 113 includes copper phthalocyanine (CuPc), N,N'-Di(naphthalene-1-yl)-N,N'-diphenyl-benzidine (α-NPB), and tris-8-hydroxyquinoline aluminum (Alq3). The small molecule organic material layers can be formed by a vacuum evaporation method using masks.

If the intermediate layer 113 is formed of a polymer organic material, the intermediate layer 113 can have a structure in which an HTL and an EML are included. The polymer HTL can be formed of poly-(2,4)-ethylene-dihydroxy thiophene (PEDOT) and the light emitting layer can be formed of poly-phenylenevinylene (PPV) or polyfluorene.

The organic light emitting device 130 is electrically connected to the thin film transistor 120 formed thereunder. In this case, if a planarizing film 127 covering the thin film transistor 120 is formed, the organic light emitting device 130 is disposed on the planarizing film 127, and the pixel electrode 111 of the organic light emitting device 130 is electrically connected to the thin film transistor 120 through a contact hole (not shown in the Figures) that is formed in the planarizing film 127.

FIG. 3 is a schematic cross-sectional view of an organic light emitting display apparatus 200 according to a second embodiment of the present invention. The organic light emitting display apparatus 200 of FIG. 3 is different from the organic light emitting display apparatus 100 of FIGS. 1 and 2 in that a reflection member 203 is positioned at a different location from the reflection member 103. That is, a substrate 201, an organic light emitting unit 210, a thin film transistor 220, a buffer layer 221, a semiconductor layer 222, a source region 222a, a drain region 222c, a channel region 222b, a gate electrode 224, a source electrode 226a, a drain electrode 226b, a gate insulating film 223, an interlayer insulating layer 225, a planarizing film 227, a pixel defining layer 212, an organic light emitting device 230, a pixel electrode 211, a intermediate layer 213, a facing electrode 214, and a sealing member 202 in the organic light emitting display apparatus 200 of FIG. 3 all are respectively identical to the substrate 101, the thin film transistor 120, the buffer layer 121, the semiconductor layer 122, the source region 122a, the drain region 122c, the channel region 122b, the gate electrode 124, the source electrode 126a, the drain electrode 126b, the gate insulating film 123, the interlayer insulating layer 125, the planarizing film 127, the pixel defining layer 112, the organic light emitting device 130, the pixel electrode 111, the intermediate layer 113, the facing electrode 114, and the sealing member 102 in the organic light emitting display apparatus 100 of FIG. 2, and thus, the descriptions thereof will not be repeated.

Referring to FIG. 3, the reflection member 203 is disposed in a non-light emitting region C of the organic light emitting unit 210. More specifically, the reflection member 203 can be formed on the facing electrode 214 to correspond to the pixel defining layer 212. The reflection member 203 of the organic light emitting display apparatus 200 and the reflection member 103 of the organic light emitting display apparatus 100 are both positioned in the non-light emitting region C. However, the reflection member 203 of the organic light emitting display apparatus 200 is not disposed on the sealing member 202 but on the facing electrode 214 formed on the pixel defining layer 212. In the case of the top emission type organic light emitting display apparatus 200, light generated from the organic light emitting device 230 is emitted to the outside through the sealing member 202. However, since the reflection member 203 is disposed on the facing electrode 214 formed on the pixel defining layer 212 which is not formed in a light emitting path, the optical extraction rate can be increased.

The reflection member 203 can be formed of a material that can reflect light proceeding towards the reflection member 203 from outside of the organic light emitting display apparatus 200, and in particular, can be formed of a metal that can reflect light. For example, the reflection member 203 can be formed of Al, Cr, Ag, Fe, Pt or Hg. Preferably, the metal can be Al. If Al is used, the reflection member 203 has a thickness of 250 Å or greater, and the reflected percentage of visible light is 75 to 90%.

Since the reflection member 203 is formed of a material that can reflect light proceeding towards the reflection member 203 from outside of the organic light emitting display apparatus 200, when the organic light emitting device 230 does not emit light, the reflection member 203 can perform as a mirror by reflecting light entering from the outside. In the organic light emitting display apparatus 200 having the above configuration, a single light emission face can simultaneously perform as a display and as a mirror.

FIG. 4 is a schematic cross-sectional view of an organic light emitting display apparatus 300 according to another embodiment of the present invention. The organic light emitting display apparatus 300 of FIG. 4 is different from the organic light emitting display apparatus 100 of FIGS. 1 and 2 in that a reflection member 303 is positioned at a different location from the reflection member 103. That is, a substrate 301, an organic light emitting unit 310, a thin film transistor 320, a buffer layer 321, a semiconductor layer 322, a source region 322a, a drain region 322c, a channel region 322b, a gate electrode 324, a source electrode 326a, a drain electrode 326b, a gate insulating film 323, an interlayer insulating layer 325, a planarizing film 327, a pixel defining layer 312, an organic light emitting device 330, a pixel electrode 311, a intermediate layer 313, a facing electrode 314, and a sealing member 302 in the organic light emitting display apparatus 300 of FIG. 4 all are respectively identical to the substrate 101, the thin film transistor 120, the buffer layer 121, the semiconductor layer 122, the source region 122a, the drain region 122c, the channel region 122b, the gate electrode 124, the source electrode 126a, the drain electrode 126b, the gate insulating film 123, the interlayer insulating layer 125, the planarizing film 127, the pixel defining layer 112, the organic light emitting device 130, the pixel electrode 111, the intermediate layer 113, the facing electrode 114, and the sealing member 102 in the organic light emitting display apparatus 100 of FIG. 2, and thus, the descriptions thereof will not be repeated.

Referring to FIG. 4, the reflection member 303 is disposed on a non-light emitting region C. More specifically, the reflection member 303 is disposed on the pixel defining layer 312, and the facing electrode 314 can be formed to cover the intermediate layer 313 and the reflection member 303. In the case of the top emission type organic light emitting display apparatus 300, since the facing electrode 314 is a transparent electrode, although the reflection member 303 is covered by the facing electrode 314, light proceeding towards the reflection member 303 from the outside can be reflected. Thus, the organic light emitting display apparatus 300 can function as a mirror where the organic light emitting device 330 does not emit light. Since the reflection member 303 is not disposed on a light emitting path in the organic light emitting device 330, the optical extraction rate of the organic light emitting display apparatus 300 can be increased.

The reflection member 303 is formed of a material that can reflect light proceeding towards the reflection member 303 from the outside of the organic light emitting display apparatus 300, and in particular, can be formed of a metal that can reflect light. For example, the reflection member 303 can be formed of Al, Cr, Ag, Fe, Pt or Hg. Preferably the reflection member 303 can be formed of Al. As described above, if Al is used, the reflection member 303 has a thickness of 250 Å or greater, and the reflected percentage of visible light is 75 to 90%.

Figure 5:
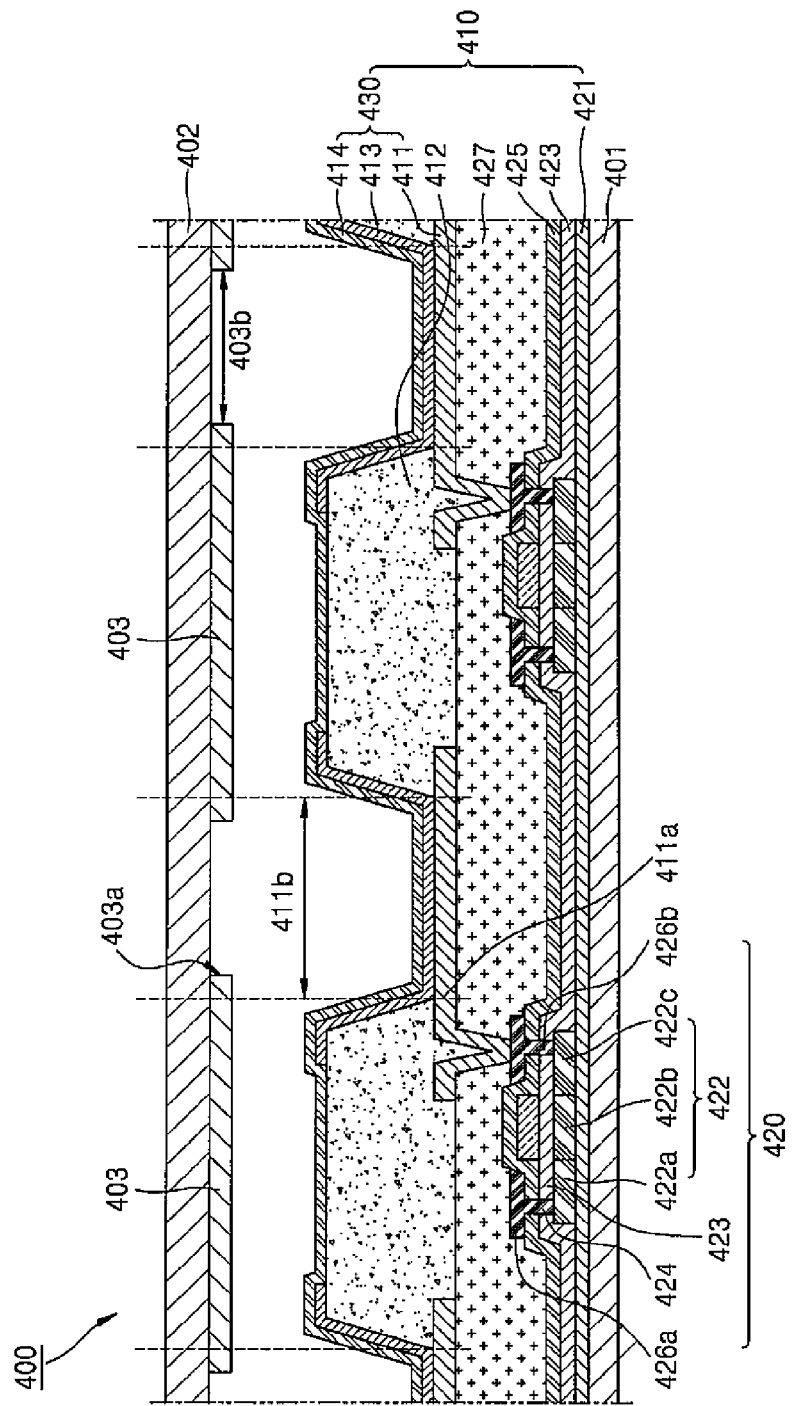
FIG. 5 is a cross-sectional view of an organic light emitting display apparatus 400 according to another embodiment of the present invention.
Figure 6:
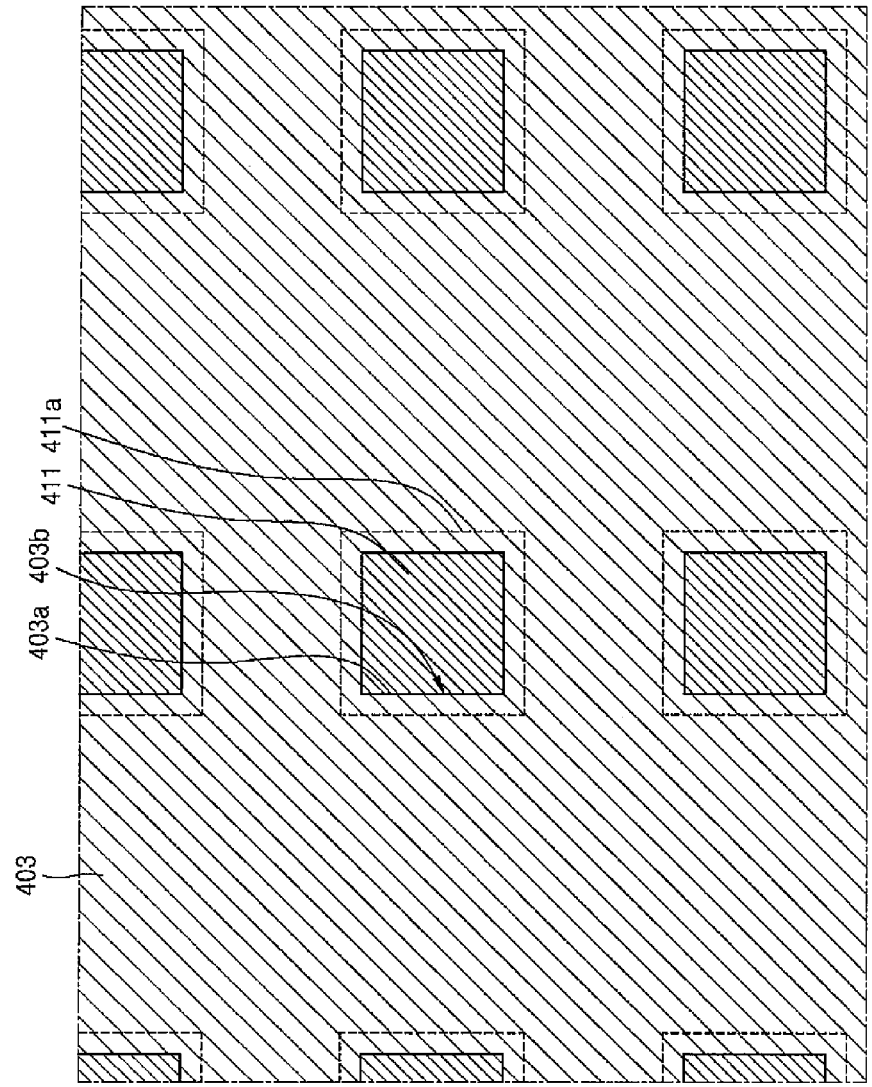
FIG. 6 is a plan view of a reflection member and a pixel electrode of the organic light emitting display apparatus of FIG. 5.

FIG. 5 is a cross-sectional view illustrating an organic light emitting display apparatus 400 according to another embodiment of the present invention, and FIG. 6 is a plan view illustrating a reflection member 403 and a pixel electrode 411 of the organic light emitting display apparatus 400 of FIG. 5. In FIG. 5, a substrate 401, a buffer layer 421, a semiconductor layer 422, a source region 422a, a drain region 422c, a channel region 422b, a gate electrode 424, a source electrode 426a, a drain electrode 426b, a gate insulating layer 423, an interlayer insulating layer 425, a planarizing film 427, a pixel defining layer 412, an organic light emitting device 430, a pixel electrode 411, an intermediate layer 413, a facing electrode 414, and a sealing member 402 of the organic light emitting display apparatus 400 respectively correspond to the substrate 101, the buffer layer 121, the semiconductor layer 122, the source region 122a, the drain region 122c, the channel region 122b, the gate electrode 124, the source electrode 126a, the drain electrode 126b, the gate insulating layer 123, the interlayer insulating layer 125, the planarizing film 127, the pixel defining layer 112, the organic light emitting device 130, the pixel electrode 111, the intermediate layer 113, the facing electrode 114, and the sealing member 102 of the organic light emitting display apparatus 100 of FIG. 2. Thus, description of these elements will not be provided here.

Referring to FIGS. 5 and 6, the reflection member 403 is disposed on a surface of the sealing member 402 facing the substrate 401, and may have an opening portion 403b that exposes a portion of the pixel electrode 411. That is, the reflection member 403 is disposed on the surface of the sealing member 402 facing the pixel electrode 411, and may include the opening portion 403b that is patterned so as to expose a portion of the pixel electrode 411. As illustrated in FIG. 6, the opening portion 403b of the reflection member 403 may be formed such that a boundary portion 403a of the opening portion 403b is disposed closer to (e.g., corresponds to or is aligned with) a center of the organic light emitting device 430, i.e., the intermediate layer 413, than a boundary portion 411a of a region 411b of the pixel electrode 411 that is exposed by (e.g., not covered by) the pixel defining layer 412. Accordingly, a surface area of the opening portion 403b is smaller than the region 411b of the pixel electrode 411 that is exposed by (e.g., not covered by) the pixel defining layer 412.

As the boundary portion 403a of the opening portion 403b is disposed closer to (e.g., corresponds to or is aligned with) the center of the organic light emitting device 430 than the boundary region 411a of the region 411b of the pixel electrode 411 exposed by (e.g., not covered by) the pixel defining layer 412 as described above, leakage of light that is caused as light generated from the intermediate layer 413 is emitted to the outside via the opening portion 403b of the reflection member 403 may be reduced or prevented. That is, if the boundary portion 403a of the opening portion 403b of the reflection member 403 is disposed farther away from the center of the organic light emitting device 430 than the boundary portion 411a of the region 411b of the pixel electrode 411 exposed by (e.g., not covered by) the pixel defining layer 412, a surface area of the opening portion 403b of the reflection member 403 is larger than a surface area of the region 411b of the pixel electrode 411 exposed by (e.g., not covered by) the pixel defining layer 412, and thus light may leak through the opening portion 403b of the reflection member 403. However, according to an embodiment of the present invention, as the surface area of the opening portion 403b of the reflection member 403 is smaller than the surface area of the region 411b of the pixel electrode 411 exposed by (e.g., not covered by) the pixel defining layer 412, light leakage through the opening portion 403b of the reflection member 403 may be reduced or prevented.

The reflection member 403 may function as a mirror reflecting external light when the organic light emitting display apparatus 400 does not operate.

The organic light emitting display apparatus 400 illustrated in FIG. 5 may form an image by emitting light outside the sealing member 402.

Figure 7:
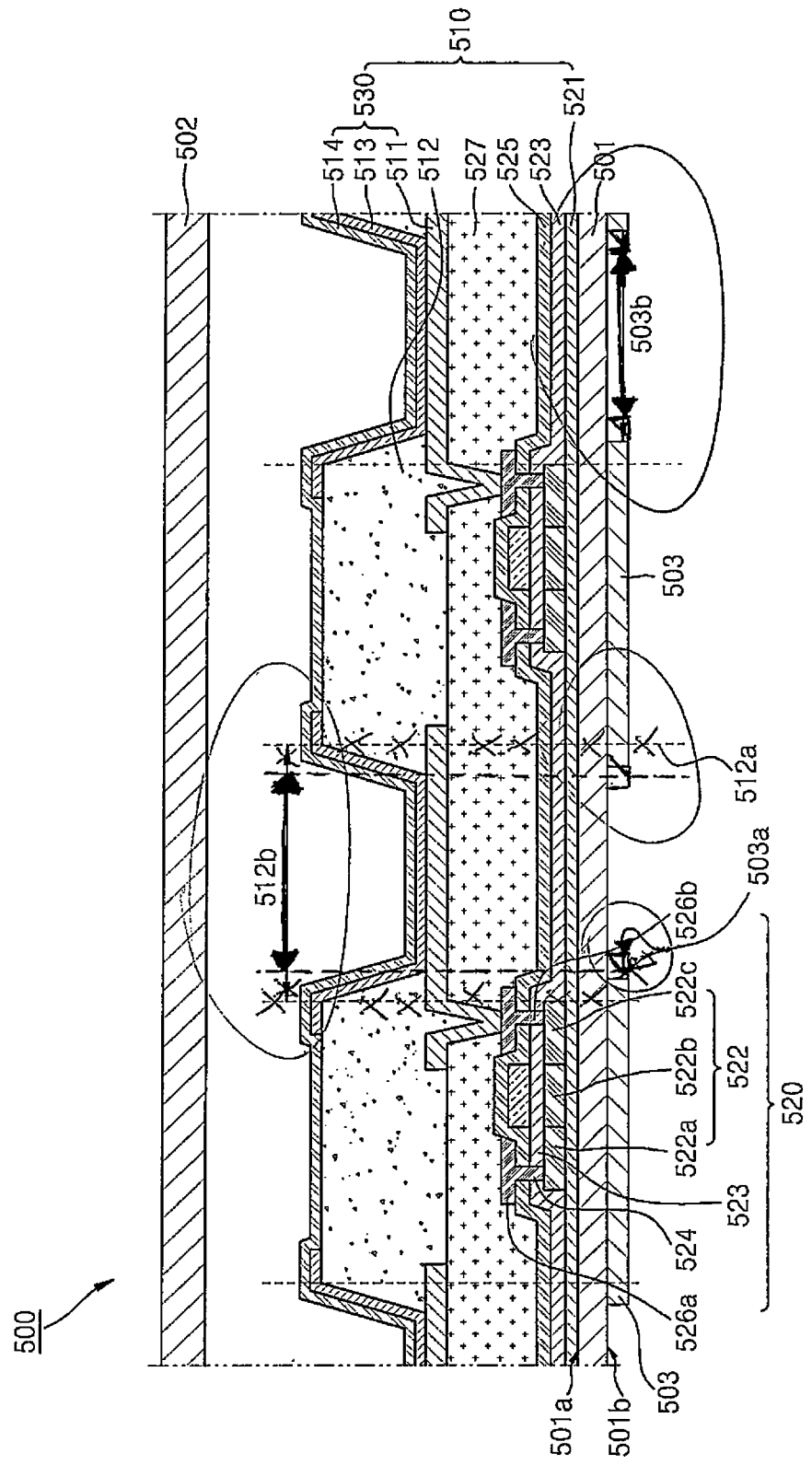
FIG. 7 is a cross-sectional view of an organic light emitting display apparatus according to another embodiment of the present invention.
Figure 8:
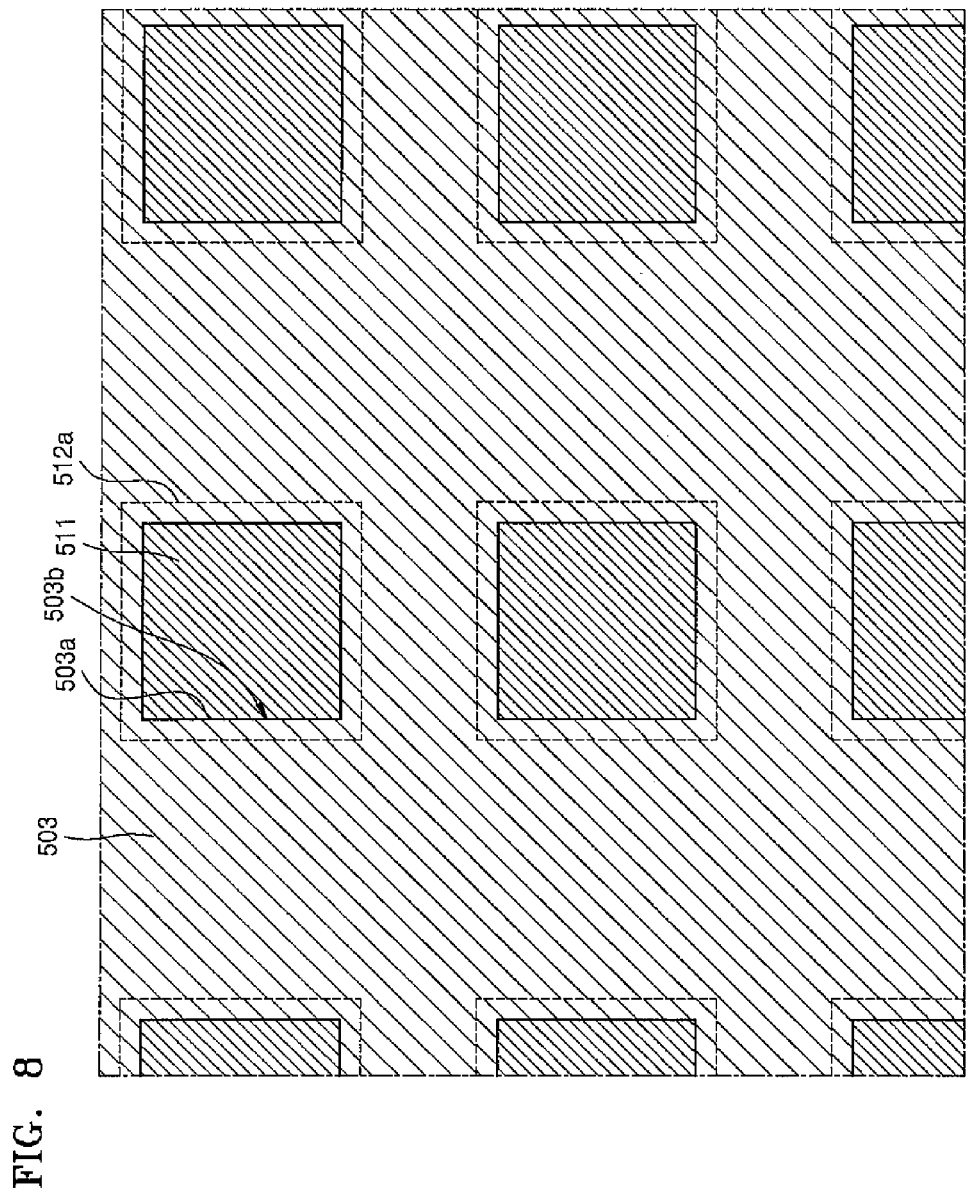
FIG. 8 is a plan view of a reflection member and a pixel electrode of the organic light emitting display apparatus of FIG. 7.

FIG. 7 is a cross-sectional view illustrating an organic light emitting display apparatus 500 according to another embodiment of the present invention, and FIG. 8 is a plan view illustrating a reflection member 503 and a pixel electrode 511 of the organic light emitting display apparatus 500 of FIG. 7. In FIG. 7, a substrate 501, a buffer layer 521, a semiconductor layer 522, a source region 522a, a drain region 522c, a channel region 522b, a gate electrode 524, a source electrode 526a, a drain electrode 526b, a gate insulating layer 523, an interlayer insulating layer 525, a planarizing film 527, a pixel defining layer 512, an organic light emitting device 530, a pixel electrode 511, an intermediate layer 513, a facing electrode 514, and a sealing member 502 of the organic light emitting display apparatus 500 respectively correspond to the substrate 101, the buffer layer 121, the semiconductor layer 122, the source region 122a, the drain region 122c, the channel region 122b, the gate electrode 124, the source electrode 126a, the drain electrode 126b, the gate insulating layer 123, the interlayer insulating layer 125, the planarizing film 127, the pixel defining layer 112, the organic light emitting device 130, the pixel electrode 111, the intermediate layer 113, the facing electrode 114, and the sealing member 102 of the organic light emitting display apparatus 100 of FIG. 2. Thus, description of these elements will not be provided here.

Referring to FIGS. 7 and 8, the pixel defining layer 512 may include (e.g., define) a first opening portion 512b exposing a portion of the pixel electrode 511. The reflection member 503 is disposed on a second surface 501b opposite a first surface 501a of the substrate 501 and may include a second opening portion 503b that exposes the pixel electrode 511. That is, in one embodiment the reflection member 503 is disposed on the second surface 501b of the substrate 501 facing the outside, and may include the second opening portion 503b that is patterned to expose a portion of the pixel electrode 511. As illustrated in FIG. 8, a boundary portion 503a of the second opening portion 503b of the reflection member 503 is disposed closer to (e.g., corresponds to or is aligned with) a center of the organic light emitting device 530 i.e., the intermediate layer 513 than a boundary portion 512a of the first opening portion 512b of the pixel defining layer 512. Accordingly, a surface area of the second opening portion 503b is smaller than a surface area of the first opening portion 512b of the pixel defining layer 512.

As the boundary portion 503a of the second opening portion 503b is disposed closer to (e.g., corresponds to or is aligned with) the center of the organic light emitting device 530 than the boundary portion 512a of the first opening portion 512b, leakage of light that is caused as light generated from the intermediate layer 513 is emitted to the outside via the second opening portion 503b of the reflection member 503 may be reduced or prevented. That is, if the boundary portion 503a of the second opening portion 503b of the reflection member 503 is disposed farther away from the center of the organic light emitting device 530 than the boundary portion 512a of the first opening portion 512b of the pixel defining layer 512, a surface area of the second opening portion 503b of the reflection member 503 is larger than a surface area of the first opening portion 512b of the pixel defining layer 512, and thus light may leak through the second opening portion 503b of the reflection member 503. However, according to an embodiment of the present invention, as the surface area of the second opening portion 503b of the reflection member 503 is smaller than the surface area of the first opening portion 512b of the pixel defining layer 512, light leakage through the second opening portion 503b of the reflection member 503 may be reduced or prevented.

The reflection member 503 may function as a mirror reflecting external light when the organic light emitting display apparatus 500 does not operate.

The organic light emitting display apparatus 500 illustrated in FIG. 7 may form an image by emitting light outside the substrate 501.

The organic light emitting display apparatus 500 illustrated in FIG. 7 may further include a second substrate (not shown) that is disposed on the second surface 501b of the substrate 501 so as to cover the reflection member 503.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An organic light emitting display apparatus, comprising:
    a substrate and a sealing member that are separated from each other;
    a pixel electrode on the substrate;
    a pixel defining layer on the pixel electrode and exposing a portion of the pixel electrode;
    an intermediate layer comprising a light emitting layer on the exposed portion of the pixel electrode;
    a facing electrode on the pixel defining layer and the intermediate layer; and
    a reflection member on a surface of the sealing member facing the substrate and patterned to have an opening portion that exposes the pixel electrode, the reflection member not exposing any portion of the pixel defining layer,
    wherein the opening portion is formed such that a boundary portion of the opening portion is closer to a center of the intermediate layer than a boundary portion of the portion of the pixel electrode exposed by the pixel defining layer.

2. The organic light emitting display apparatus of claim 1, wherein a surface area of the opening portion is smaller than a surface area of the portion of the pixel electrode exposed by the pixel defining layer.

3. The organic light emitting display apparatus of claim 1, wherein light emitted from the light emitting layer is formed into an image via the sealing member.

4. An organic light emitting display apparatus, comprising:
    a substrate and a sealing member that are separated from each other;
    a pixel electrode on a first surface of the substrate;
    a pixel defining layer on the pixel electrode and comprising a first opening portion that exposes a portion of the pixel electrode;
    an intermediate layer comprising a light emitting layer on the exposed portion of the pixel electrode;
    a facing electrode on the pixel defining layer and the intermediate layer; and
    a reflection member on a second surface of the substrate opposite the first surface and patterned to have a second opening portion that exposes the pixel electrode,
    wherein the second opening portion is formed such that a boundary portion of the second opening portion is closer to a center of the intermediate layer than a boundary portion of the first opening portion.

5. The organic light emitting display apparatus of claim 4, wherein a surface area of the second opening portion is smaller than a surface area of the first opening portion.

6. The organic light emitting display apparatus of claim 4, wherein light emitted from the light emitting layer is formed into an image by emitting the light outside the substrate.

* * * * *